US009674465B2

(12) United States Patent
Shan et al.

(10) Patent No.: US 9,674,465 B2
(45) Date of Patent: Jun. 6, 2017

(54) NON-VISIBLE ILLUMINATION SCHEME

(71) Applicant: OMNIVISION TECHNOLOGIES, INC., Santa Clara, CA (US)

(72) Inventors: Jizhang Shan, Cupertino, CA (US); Ming-Kai Hsu, Fremont, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 41 days.

(21) Appl. No.: 14/729,585

(22) Filed: Jun. 3, 2015

(65) Prior Publication Data
US 2016/0360124 A1 Dec. 8, 2016

(51) Int. Cl.
| | |
|---|---|
| *H04N 9/73* | (2006.01) |
| *H04N 5/33* | (2006.01) |
| *H04N 5/353* | (2011.01) |
| *H04N 5/374* | (2011.01) |
| *H04N 5/225* | (2006.01) |
| *H04N 5/235* | (2006.01) |
| *H04N 9/04* | (2006.01) |

(52) U.S. Cl.
CPC .......... *H04N 5/332* (2013.01); *H04N 5/2256* (2013.01); *H04N 5/2352* (2013.01); *H04N 5/3532* (2013.01); *H04N 5/374* (2013.01); *H04N 9/045* (2013.01)

(58) Field of Classification Search
CPC .......... H04N 5/33; H04N 5/332; H04N 9/045; H04N 5/2256; H04N 5/374; H04N 5/3532; H04N 5/2352
USPC .......................... 348/223.1–229.1, 272–280
See application file for complete search history.

(56) References Cited

U.S. PATENT DOCUMENTS

| | | | | |
|---|---|---|---|---|
| 6,239,840 | B1 * | 5/2001 | Shibuya | H04N 5/2351 348/297 |
| 6,292,212 | B1 * | 9/2001 | Zigadlo | H04N 5/33 250/338.1 |
| 8,446,470 | B2 | 5/2013 | Lu et al. | |
| 2007/0221849 | A1 * | 9/2007 | Tabirian | G01S 17/89 250/341.1 |
| 2011/0260059 | A1 * | 10/2011 | Jiang | H01L 27/1461 250/330 |

(Continued)

OTHER PUBLICATIONS

ROC (Taiwan) Pat. Appl. No. 105117453—First Office Action with English Translation mailed Feb. 3, 2017, 13 pages.

*Primary Examiner* — Yogesh Aggarwal
(74) *Attorney, Agent, or Firm* — Blakely Sokoloff Taylor & Zafman LLP

(57) ABSTRACT

Embodiments of an apparatus and process are described. The process includes capturing a first image frame using an image sensor, the image sensor including a pixel array comprising a plurality of pixels arranged in rows and columns and a color filter array optically coupled to the pixel array. A region of interest within the first image frame is determined, and the exposure time of the image sensor is adjusted to eliminate a substantial fraction of the visible light captured by the image sensor. A rolling shutter procedure is used with the pixel array to capture at least one subsequent frame using the adjusted exposure time, and a source of invisible radiation is activated while the rolling shutter enters the region of interest and deactivated when the rolling shutter exits the region of interest. Finally, an image of the region of interest is output. Other embodiments are disclosed and claimed.

15 Claims, 9 Drawing Sheets

(56) References Cited

U.S. PATENT DOCUMENTS

2011/0298886 A1\* 12/2011 Price ................... H04N 5/2351
  348/14.08
2011/0304614 A1   12/2011 Yasunaga
2014/0160253 A1   6/2014 Backman et al.

\* cited by examiner

NON-VISIBLE ILLUMINATION SCHEME

TECHNICAL FIELD

The disclosed embodiments relate generally to digital photography and in particular, but not exclusively, to an illumination scheme that improves imaging at with non-visible wavelengths while decreasing power consumption.

BACKGROUND

Cameras are incorporated into many kinds of mobile devices such as cell phones, smart phones tablets and the like so much that nowadays virtually every mobile device includes a camera. Initially the camera's function was simply to take pictures, but many cameras are now also used for additional functions such as user identification and validation, gesture recognition, and so on. For various reasons many of these additional functions must be carried out using non-visible (i.e., invisible) light such as infrared, and so the mobile devices must also include some kind of radiation (i.e., light) source that provides the needed non-visible radiation.

Many mobile devices operate using batteries and are therefore power-constrained—that is, they can provide only a limited amount of power before the battery runs out and must be recharged. Regardless of battery capacity, too-short battery life (how long a battery lasts between charges) is a constant user complaint. But in most devices that have a non-visible light source it is used is very inefficiently, meaning that the non-visible light source drains more power than needed from the battery and leads to a shorter battery life than necessary.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

DETAILED DESCRIPTION OF EMBODIMENTS

Embodiments are described of an apparatus, system and method for a non-visible illumination scheme that improves image capture while decreasing power consumption. Specific details are described to provide a thorough understanding of the embodiments, but one skilled in the relevant art will recognize that the invention can be practiced without one or more of the described details, or with other methods, components, materials, etc. In some instances, well-known structures, materials, or operations are not shown or described in detail but are nonetheless encompassed within the scope of the invention.

Reference throughout this description to "one embodiment" or "an embodiment" means that a described feature, structure, or characteristic can be included in at least one described embodiment, so that appearances of "in one embodiment" or "in an embodiment" do not necessarily all refer to the same embodiment. Furthermore, the particular features, structures, or characteristics describe can be combined in any suitable manner in one or more embodiments.

Figure 1A:
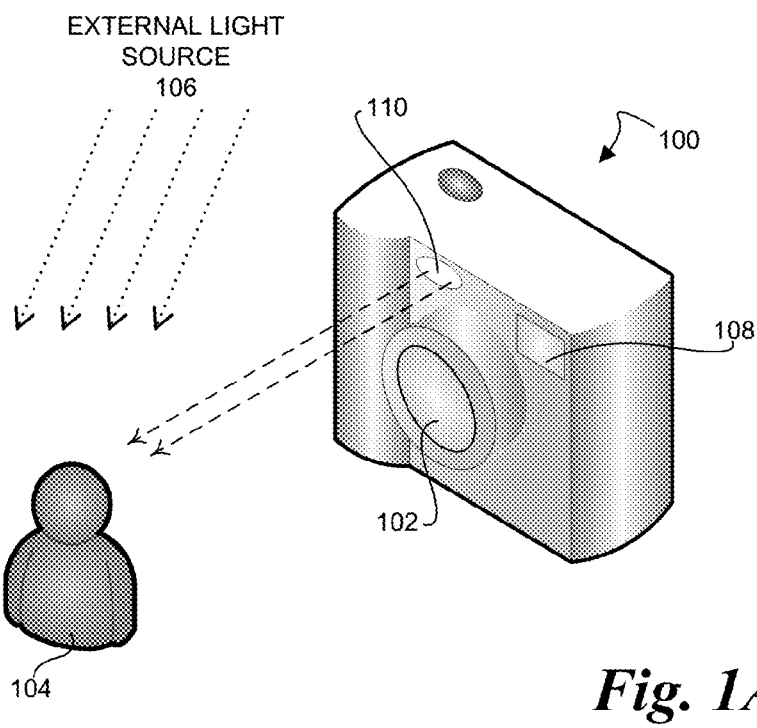
FIGS. 1A-1B are perspective and cross-sectional drawings of an embodiment of an image capture device including non-visible lighting.
Figure 1B:
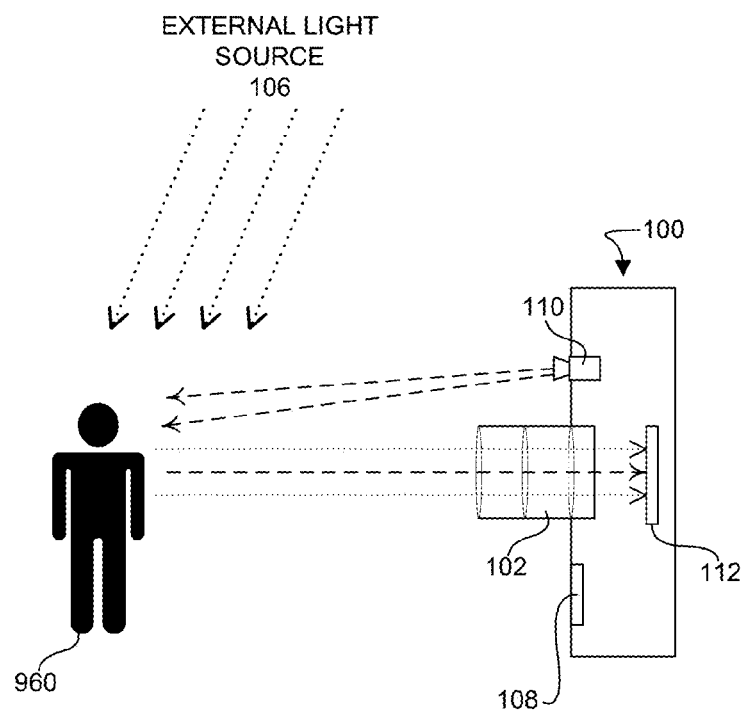

FIGS. 1A-1B together illustrate an embodiment of an image capture device 100. The illustrated embodiment of device 100 is a camera, but in other embodiments device 100 can be any device that includes an image sensor, such as a mobile phone, smart phone, template, laptop etc.

Device 100 includes optics 102 for focusing an image of an object 104 onto an image sensor 112 within the device. In one embodiment image sensor 112 can be a CMOS image sensor such as the ones shown in FIGS. 2A-2C, but in other embodiments can be another type of image sensor. Object 104 can be illuminated by different light sources. It can be illuminated by an external light source 106 which keep it can be natural light (i.e., sunlight) if object 104 is outdoors or artificial light if object 104 is indoors. If external light source 106 is to dim to properly illuminate object 104, an onboard visible light source 108 mounted on or in device 100 can replace or supplement external light source 106 to illuminate object 104. Finally, an onboard non-visible (i.e., invisible) light source 110 can be used to illuminate object 104 with non-visible radiation for special imaging situations. In one embodiment, non-visible light source 110 can be an infrared light source, but in other embodiments can be a non-visible light source that emits at another wavelength such as ultraviolet. Among other things, non-visible light source 110 can be used for special imaging situations such as identity verification. In a smartphone, for instance, non-visible wavelengths can be used to perform a retinal scan to verify that the person trying to use the smart phone is its rightful owner. But of course use of on-visible light source 110 is not limited to this particular application. Other applications for which it could be used include iris recognition, vein recognition, gesture detection, motion detection, face detection, proximity detection, and so on.

In operation of device 100, all or part of object 104 is illuminated by one or both of external light source 106 or onboard visible light source 108 for normal (i.e., visible) imaging. And if a situation requiring non-visible light source 110 is present, all or part of object 104 can be illuminated with non-visible light source 110. Whatever light source is used to illuminate object 104, light incident on object 104 from a source reflects from the object and is focused by optics 102 onto image sensor 112. Image sensor 112 has an exposure cycle during which it captures the light focused on it by optics 102 and generates electric signals that then form the basis of a digital image of object 104.

In existing systems, when non-visible light source 110 is used it stays on during the entire exposure cycle of the image sensor, even if it is only needed to capture an image of part of the object. For instance, identity verification using a retinal scan needs only an image of the eyes, not an image of the entire person or even the entire face. But light sources like non-visible light source 110 can use a significant amount of power, and that can be a problem in devices that have power constraints—for instance, devices that operate using batteries. The embodiments described below reduce this problem by using a smart illumination scheme for non-visible light source 110.

Figure 2A:
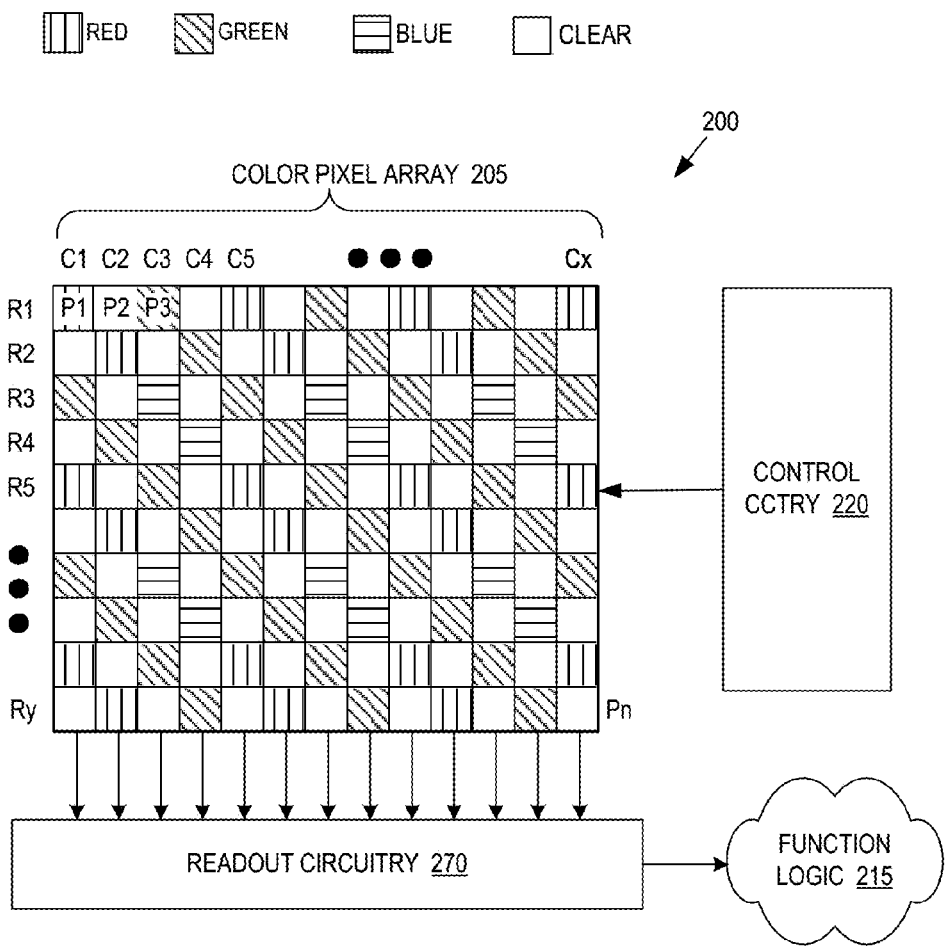
FIG. 2A is a schematic of an embodiment of an image sensor including a color filter array
Figure 2B:
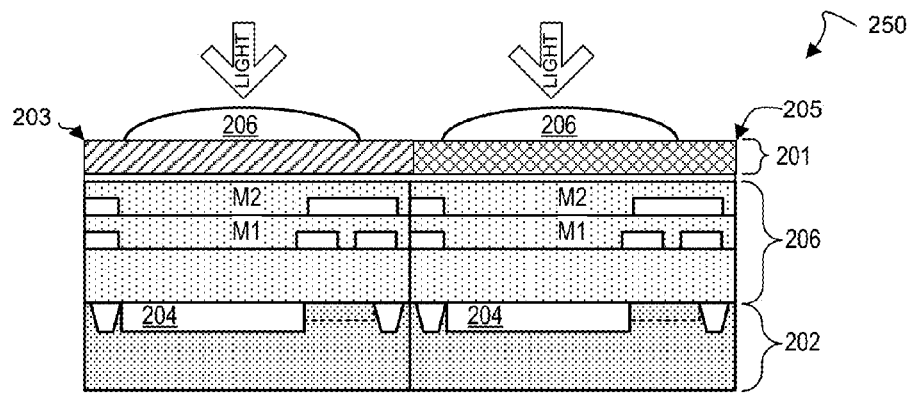
FIGS. 2B-2C are, respectively, cross-sections of embodiments of a pair of frontside-illuminated pixels and embodiments of a pair of backside-illuminated pixels.

FIG. 2A illustrates an embodiment of a complementary metal oxide semiconductor (CMOS) image sensor 200 including a color pixel array 205, readout circuitry 270 coupled to the pixel array, function logic 215 coupled to the readout circuitry, and control circuitry 220 coupled to the pixel array. Color pixel array 205 is a two-dimensional ("2D") array of individual imaging sensors or pixels (e.g., pixels P1, P2 . . . , Pn) having X pixel columns and Y pixel rows. Color pixel array 205 can be implemented as a frontside-illuminated image sensor, as shown in FIG. 2A, or as a backside-illuminated image sensor, as shown in FIG. 2B. As illustrated, each pixel in the array is arranged into a row (e.g., rows R1 to Ry) and a column (e.g., column C1 to Cx) to acquire image data of a person, place, or object, which can then be used to render a 2D image of the person, place, or object. Color pixel array 205 assigns color to each pixel using a color filter array (CFA) coupled to the pixel array, as further discussed below in connection with the disclosed embodiments of color filter arrays.

After each pixel in pixel array 205 has acquired its image data or image charge, the image data is read out by readout circuitry 270 and transferred to function logic 215 for storage, additional processing, etc. Readout circuitry 270 can include amplification circuitry, analog-to-digital ("ADC") conversion circuitry, or other circuits. Function logic 215 can store the image data and/or manipulate the image data by applying post-image effects (e.g., crop, rotate, remove red eye, adjust brightness, adjust contrast, or otherwise). Function logic 215 can also be used in one embodiment to process the image data to correct (i.e., reduce or remove) fixed pattern noise. Control circuitry 220 is coupled to pixel array 205 to control operational characteristic of color pixel array 205. For example, control circuitry 220 can generate a shutter signal for controlling image acquisition.

FIG. 2B illustrates a cross-section of an embodiment of a pair of frontside-illuminated (FSI) pixels 250 in a CMOS image sensor. The front side of FSI pixels 250 is the side of substrate 202 upon which the photosensitive area 204 and associated pixel circuitry are disposed, and over which metal stack 206 for redistributing signals is formed. Metal stack 206 includes metal layers M1 and M2, which are patterned to create an optical passage through which light incident on FSI pixels 250 can reach photosensitive or photodiode ("PD") regions 204. To implement a color image sensor, the front side can include color filter array 201, with each of its individual color filters (only two individual filters 203 and 205 are illustrated in this particular cross section) disposed under a microlens 206 that aids in focusing incident light onto PD region 204. In one embodiment color filter array 201 can be a color filter array formed with any of the minimal repeating units and filters described in FIGS. 3A-3B.

Figure 2C:
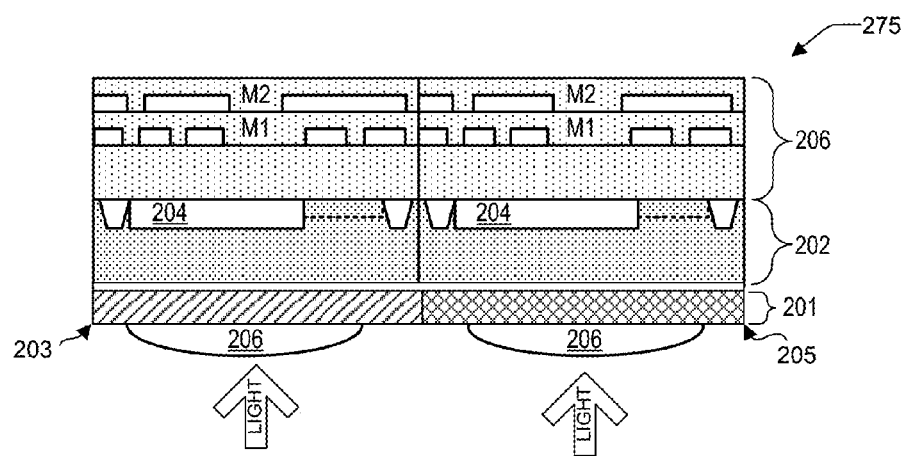

FIG. 2C illustrates a cross-section of an embodiment of a pair of backside-illuminated (BSI) pixels 275 in a CMOS image sensor. As in FSI pixels 250, the front side of pixels 275 is the side of substrate 202 upon which the photosensitive regions 204 and associated pixel circuitry are disposed, and over which metal stack 206 is formed for redistributing signals. The backside is the side of substrate 202 opposite the front side. To implement a color image sensor, the backside can include color filter array 201, with each of its individual color filters (individual filters 203 and 205 are illustrated in this particular cross section) disposed under a microlens 206. In one embodiment color filter array 201 can be a color filter array formed with any of the minimal repeating units and filters described in FIGS. 3A-3B. Microlenses 206 aid in focusing incident light onto photosensitive regions 204. Backside illumination of pixels 275 means that the metal interconnect lines in metal stack 206 do not obscure the path between the object being imaged and the photosensitive regions 204, resulting in greater signal generation by photosensitive regions 204.

Figure 3A:
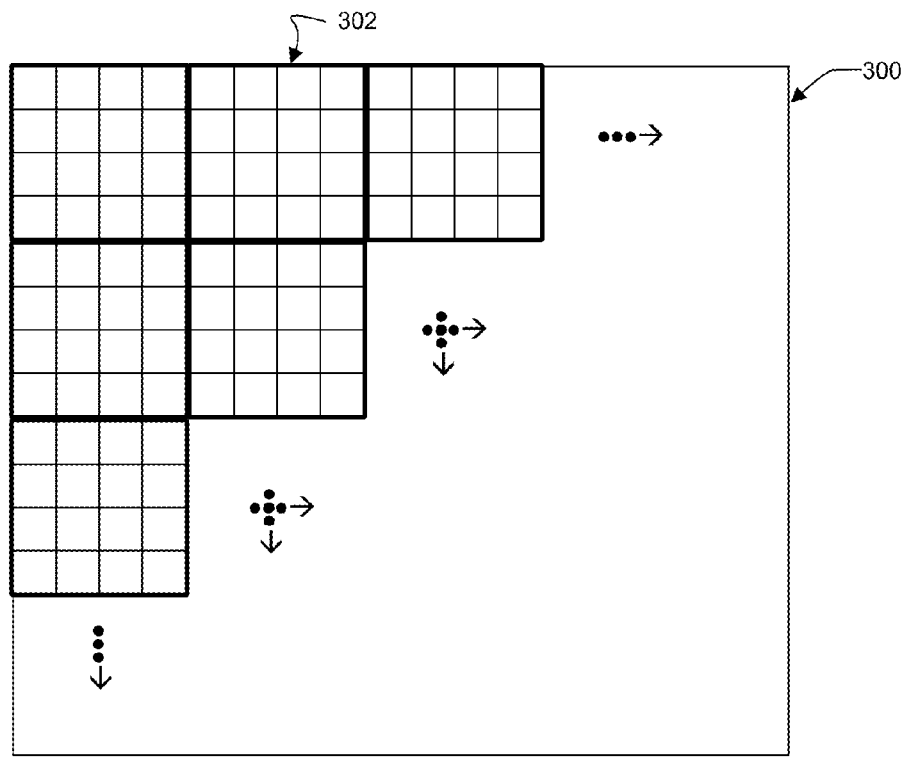
FIGS. 3A-3B are, respectively, a diagram of an embodiment of a color filter array (CFA) formed by tiling multiple minimal repeating units (MRUs) and a diagram of a pair of embodiments of an MRU.

FIG. 3A illustrates a color filter array (CFA) 300 including a plurality of minimal repeating units (MRUs) that are tiled to form the CFA. CFA 300 includes a number of individual filters that substantially corresponds to the number of individual pixels in the pixel array to which the CFA is or will be coupled. Each individual filter is optically coupled to a corresponding individual pixel in the pixel array and has a particular spectral photoresponse selected from a set of spectral photoresponses. A particular spectral photoresponse has high sensitivity to certain portions of the electromagnetic spectrum but low sensitivity to other portions of the spectrum. The pixels themselves are not colored, but because CFAs assign a separate photoresponse to each pixel by placing a filter over the pixel, it is common to refer to a pixel as a pixel of that particular photoresponse. Hence a pixel can be referred to as a "clear pixel" if it has no filter or is coupled to a clear (i.e., colorless or panchromatic) filter, as a "blue pixel" if it is coupled to a blue filter, as a "green pixel" if it is coupled to a green filter, or as a "red pixel" if it is coupled to a red filter, and so on.

The set of spectral photoresponses selected for use in a CFA usually has at least three different photoresponses, but in some embodiments can include four or more. In an embodiment of CFA 300 with four spectral photoresponses, the set of photoresponses can be red, green, blue, and clear or panchromatic (i.e., neutral or colorless). But in other embodiments CFA 300 can include other photoresponses in addition to, or instead of, those listed. For instance, other embodiments can include cyan (C), magenta (M), and yellow (Y) filters, clear (i.e., colorless) filters, infrared filters, ultraviolet filters, x-ray filters, etc. Multi-band filters, which have high sensitivity to multiple parts of the electromagnetic spectrum, can also be used in some embodiments.

The individual filters in CFA 300 are grouped into minimal repeating units (MRUs) such as MRU 302, and MRUs 302 are then tiled vertically and horizontally, as indicated by the arrows, to form CFA 300. A minimal repeating unit is a repeating unit such that no other repeating unit has fewer individual filters. A color filter array can include several different repeating units, but a repeating unit is not a minimal repeating unit if there is another repeating unit in the array with fewer individual filters. Other embodiments of CFA 300 can be tiled using an MRU that includes a greater or smaller number of pixels than illustrated for MRU 302.

Figure 3B:
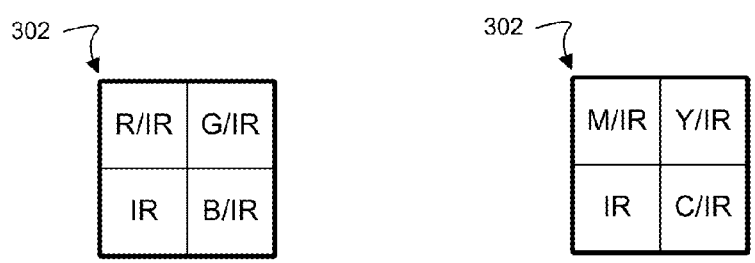

FIG. 3B illustrates embodiments of a minimal repeating unit (MRU) 302. MRU 302 includes a set of individual filters arranged in M rows and N columns; in this embodiment, M=N=2, so that MRU 302 is a 2×2 MRU with four individual filters, but in other embodiments M and N can have greater or smaller values. In still other embodiment M and N need not have the same value, so that the MRU is rectangular instead of square.

The four individual filters within MRU 302 include three dual-band filters and one single-band filter. The dual-band filters, as their name implies, have spectral photoresponses that allow them to filter two different electromagnetic wavelength bands. In the illustrated embodiments, the dual-band filters each filter a visible wavelength (e.g., red, blue, and green) and a non-visible wavelength (e.g., infrared (IR), and near infrared (NIR)) while the single-band filter filters the non-visible wavelength. This arrangement of dual-band filters and a single-band filter where the single-band filter's band matches the non-visible band of the dual-band filter allows any image sensor to which color filter array 300 is optically coupled to capture full-resolution images at the non-visible wavelength, instead of the quarter-resolution images that would be captured if only single-band filters were used in the color filter array.

In the MRU embodiment on the left, the dual-band filters have infrared as their non-visible wavelength and have red (R), green (G), and blue (B) as their visible wavelength. The embodiment shown on the right is similar except that it uses a different primary color set. Instead of the RGB color set, the embodiment on the left uses the cyan-magenta-yellow (CMY) color set for the visible wavelengths filtered by the dual-band filters. In both illustrated embodiments the single-band filter is an infrared filter, so that the non-visible wavelengths filtered by the dual-band filters are substantially the same as the non-visible wavelengths filtered by the one single-band filter.

Figure 4:
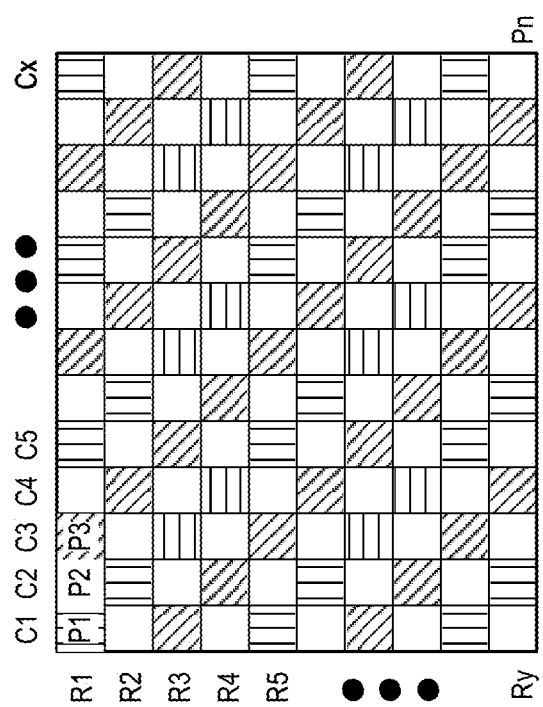
FIG. 4 is a diagram illustrating an embodiment of the operation of a rolling shutter in an image sensor.
Figure 4:
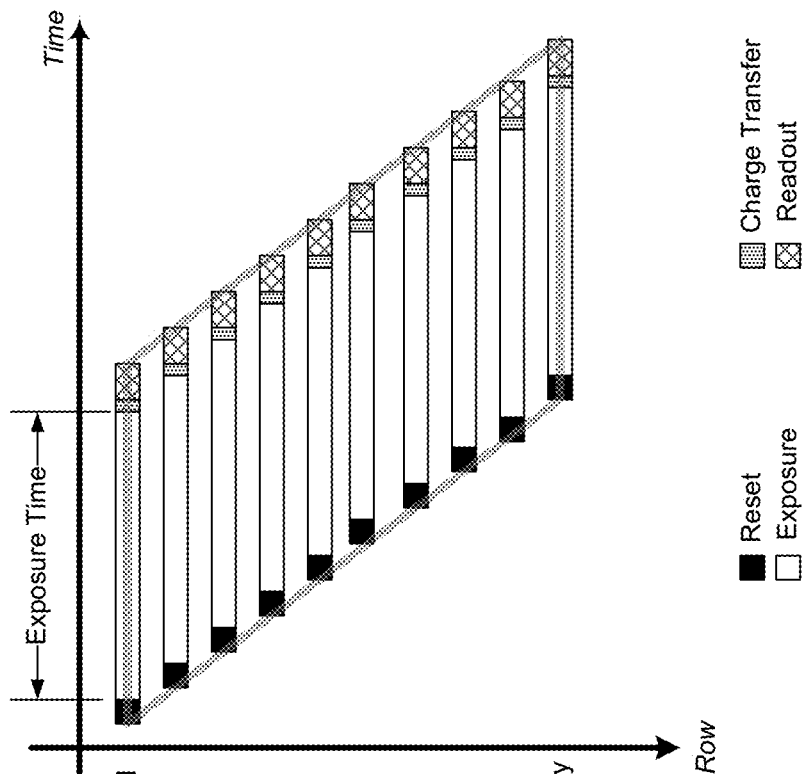

FIG. 4 illustrates an embodiment of operation of a rolling shutter generally found in CMOS image sensors. Although referred to as a "shutter," a rolling shutter is not a mechanical device that opens and closes to expose the image sensor to light. It is instead a procedure for exposing and reading pixels in a CMOS image sensor. In a rolling shutter, light exposure starts and ends at different times for different rows of pixels. First row R1 is subjected to a reset, then automatically exposed to light; thus integration (production of photoelectric charges) starts immediately after reset. After a predetermined time of light exposure (i.e., the exposure time), the first row photo charges are read out during a short readout period. The second row is then reset and starts light exposure and integration at a predetermined time after the first row is reset; but the second row readout commences readout only after the first row readout is finished, because the image sensor can only read out one row of pixels at a time. This reset, integration, and signal readout process is done row by row in the image sensor, from first row R1 to last row Ry, to produce a full image frame.

In the in the illustrated diagram the rolling shutter causes each frame captured to appear as a parallelogram because of the way the rolling shutter captures each subsequent row slightly later than the previous row. And although only one image frame is shown in FIG. 4, an image sensor usually uses its rolling shutter to capture multiple frames before producing a final output (see, e.g., FIG. 8). Many of the early frames captured are used for other purposes, such as exposure adjustment or focus adjustment, then discarded before or when the final image is captures or output.

Figure 5:
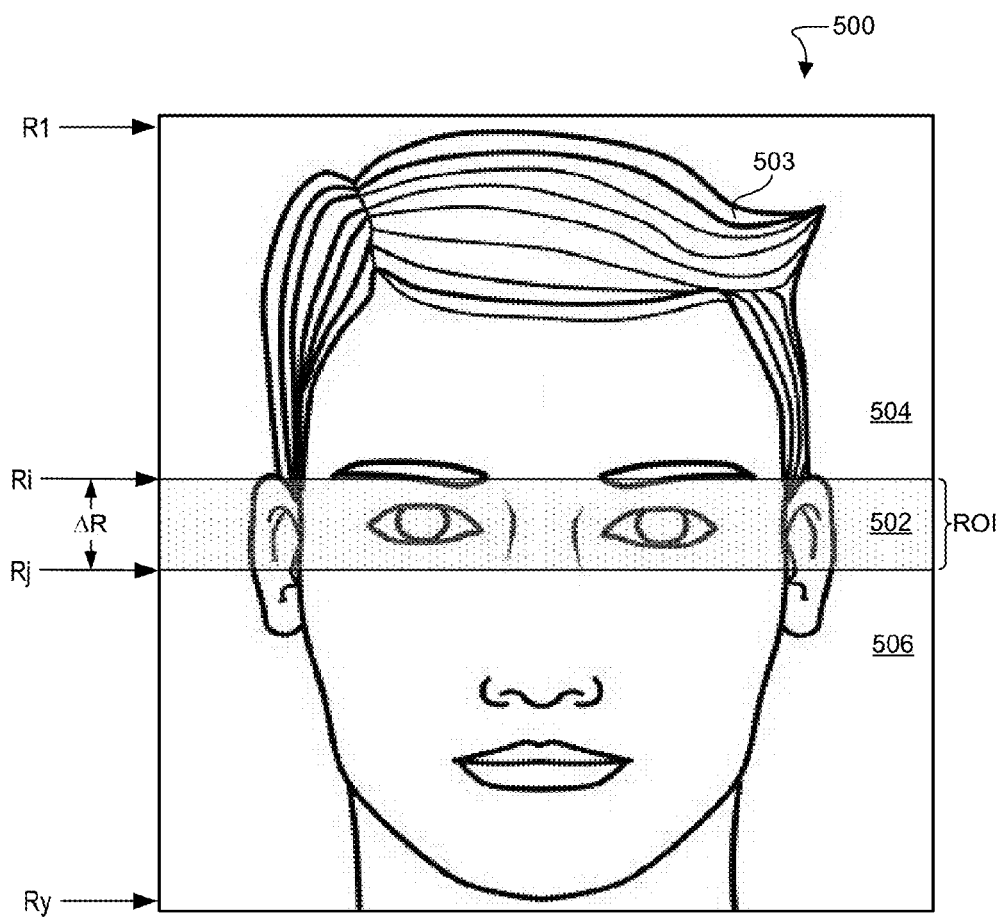
FIG. 5 is a diagram of an embodiment of an image frame including a region of interest within the frame.

FIG. 5 illustrates an embodiment of an image frame 500 of object 503 that can be captured using a rolling shutter. In one embodiment the rolling shutter starts at top row R1 and scans down through Ry in the procedure shown in FIG. 4.

Frame 500 includes a region of interest (ROI) 502 that extends vertically between row Ri and row Rj, and has a height, measured in rows, of $\Delta R$. Also within frame 500 are an upper region 504 and a lower region 506 that are within frame 500 but outside ROI 502: upper region 504 extends from the top of the frame to where ROI 502 begins at row Ri, while lower region 506 extends from where ROI 502 ends at row Rj to the bottom of frame 500.

In one embodiment, the position of ROI 502 within frame 500 is determined based upon one or more previous visible-light frames of object 503. ROI 502 includes the features of object 503 that are to be imaged with non-visible light. In the illustrated embodiment, object 503 is a person's face and ROI 502 encompasses the person's eyes; this embodiment can be useful, for instance, for identity verification using a retinal scan. In another embodiment, ROI 502 includes not only the person's eyes, but also a 10% margin above and below the eyes to ensure a full coverage of the eyes. But in other embodiments the object and region of interest can of course be different depending on the application.

Figure 6:
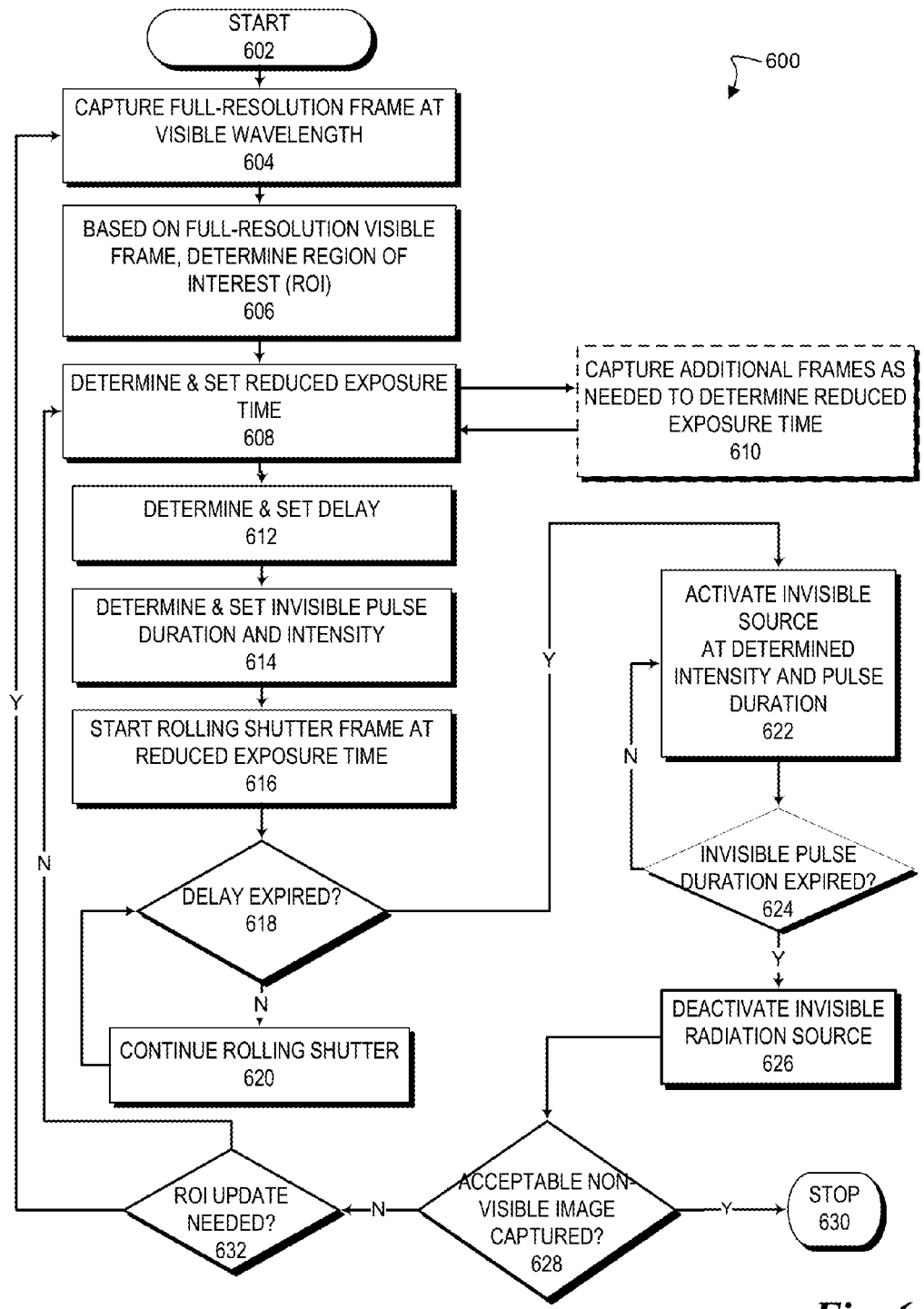
FIG. 6 is a flowchart illustrating an embodiment of a process for improved non-visible illumination and image capture.

FIG. 6 illustrates an embodiment of a process 600 for providing efficient non-visible lighting during capture of an image of a region of interest (ROI) (see FIG. 5) by image capture device 100 using a color filter array such as CFA 300 with MRU 302. The process starts at block 602. At block 604 one or more full-resolution frames of the object are captured at visible wavelengths using an external light source or an onboard visible light source (see FIGS. 1A-1B). At block 606, the full-resolution frames captured at block 604 are used to determine the region of interest within the frame, for instance using feature recognition software.

At block 608 the process determines an adjusted exposure time that will substantially reduce or eliminate the amount of visible light captured by the image sensor. If necessary the process can continue to block 610, which has a dashed outline to indicate that it is optional, where additional image frames at visible wavelengths can be captured and used to determine the adjusted exposure time. In one embodiment the process at block 610 can capture multiple frames at decreasing exposure times and use the captured frames to extrapolate the required adjusted exposure time. But in other embodiments the adjusted exposure time can be determined differently. After determining the adjusted exposure time, which is inversely related to the image sensor's frame rate (exposure time≈1/frame rate), the process sets the exposure time of the image sensor to the adjusted exposure time. In one embodiment the image sensor's exposure time can be set by adjusting the vertical blanking period, but in other embodiments it can be set differently, for instance by adjusting the sensor's frame rate.

At block 612 the process determines a delay for the non-visible light source. With reference to FIG. 5, the delay substantially corresponds to the time from when the rolling shutters starts scanning the frame at row R1 until it reaches row Ri, which marks the beginning of the ROI 502. Hence the delay depends on the value of Ri—or, put differently, on the position of ROI 502 within frame 500—as well as on the adjusted exposure time set at block 608.

At block 614 the process determines and sets the intensity and pulse duration of the non-visible light source. The intensity depends on factors such as the adjusted exposure time; the adjusted exposure time is typically made short to exclude as much visible light as possible, but the short exposure time can require a higher-intensity non-visible pulse than might otherwise be required. The duration of the non-visible pulse depends on the amount of time it takes the rolling shutter to traverse pixel rows within the ROI, which in turn depends on the exposure time and the dimensions of the ROI. In FIG. 5, for instance, the duration of the non-visible light pulse depends on the adjusted exposure time as well as on $\Delta R$, the height in rows of ROI 502.

At block 616, having set the adjusted exposure time, the delay, the duration, and the intensity, the process starts the rolling shutter at the beginning of frame 500. At block 618 the process checks whether the delay has expired. If at block 618 the delay has not expired, it means the rolling shutter is still in region 504 and has not reached ROI 502, so the process continues to block 620 where the rolling shutter keeps on capturing rows of the image frame. But if at block 618 the delay has expired, it means the rolling shutter has reached ROI 502 and the process continues to block 622, where it activates the non-visible light source at the determined intensity.

At block 624 the process checks whether the non-visible light source has been on for the determined duration. If at block 624 the non-visible light source has not been on for the duration, it means the rolling shutter is still within ROI 502 and the process returns to block 622, where it keeps the non-visible light source activated at the determined intensity. But if at block 624 the non-visible light source has been on for the determined duration, it means the rolling shutter has reached the end of ROI 502 and is about to enter region 506 where the non-visible light source is no longer needed. Because the delay has expired, the process continues to block 626 where it deactivates the non-visible light source.

At block 628 the process determines whether an acceptable image of the ROI was captured. The captured image of the ROI will be a full-resolution image because of the use of dual band filters, but it is possible that not every combination of delay, duration, and intensity will produce an acceptable image. If at block 628 the process determines that an acceptable image was captured the process continues to block 430 were it stops. But if at block 628 the process determines that an acceptable image was not captured then it proceeds to block 632.

At block 632 to the process determines if the ROI needs to be updated, for instance because object 503 has moved relative to frame 500. If at block 632 the process determines that an ROI update is needed, the process returns to block 604 and goes through the remainder of process 600. But if at block 632 the process determines that no ROI update is needed, it returns to block 608 and goes through the remainder of process 600.

Figure 7A:
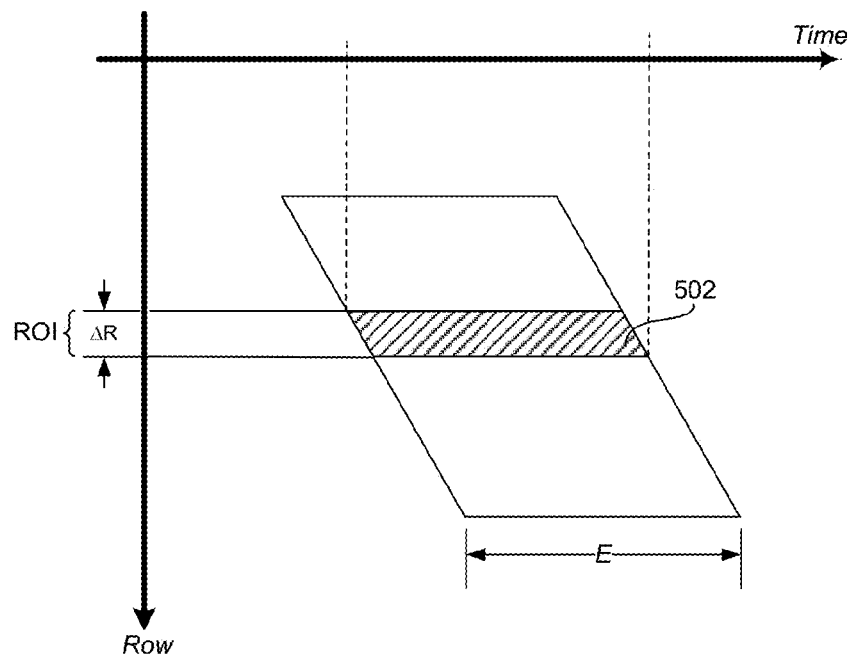
FIGS. 7A-7B are diagrams illustrating an embodiment of exposure time adjustment.
Figure 7B:
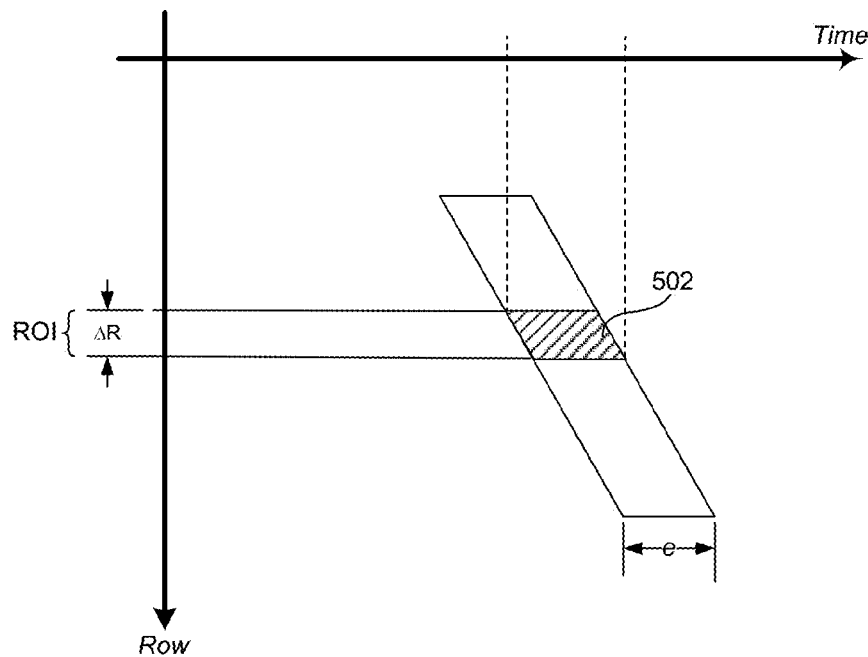

FIGS. 7A-7B illustrate an embodiment of the effect of exposure adjustment on an image frame. FIG. 7A shows a parallelogram representing a single frame, as discussed above for FIG. 4. In the illustrated single frame, the length of a side along the time axis represents the exposure time E of the frame. FIG. 7B shows the effect of shortening the exposure time to eliminate or substantially reduce visible light. The net effect of shortening the exposure time is to substantially reduce the width of the parallelogram. The number of rows in the ROI remains constant, but because the parallelogram is narrowed an image of ROI 502 can be captured much more quickly, and with a shorter non-visible illumination pulse, while excluding most or all visible light that can interfere with the capture of a non-visible ROI image. In an embodiment, the exposure time is controlled so that the image signal generated by visible light is one tenth of the image signal generated by non-visible IR light, or less. Since dual band filters generate photoelectric image signals caused by both visible light and non-visible IR light, too much visible light will cause significant noise to the desired IR image for applications such as iris recognition of the eyes. In particular, for the visible light (e.g., red, blue and green) channels, a visible light noise that is more than 10% of the IR signal may be deemed excessive. Accordingly, the exposure time for IR image generation is set to a level such that the signal to noise ratio is 10:1, or more.

Several factors determine the exposure time for the desirable ten or more signal to noise ratio. First, ambient light source that includes a high level of IR (e.g., outdoor lighting under the sun) means a relatively small amount of visible light noise and a relatively large amount of IR signal, while certain types of indoor fluorescent light (e.g., compact fluorescent light) is mostly in the visible range, thereby causing a relatively high amount of visible light noise. Second, a high wattage of the non-visible IR LED light source increases the IR signal to visible noise ratio. Third, the distance between the non-visible IR LED light source and the object (e.g., the eyes) affects the amount of non-visible IR light upon the object, following an inverse square relationship (i.e., power is inversely proportional to the square of the distance). Fourth, a longer duration of the non-visible IR radiation (e.g., non-visible IR LED pulse) increases the IR signal to visible noise ratio. Fifth, a shorter exposure time of image sensor pixels (that include dual band visible plus non-visible IR pixels) reduces the noise caused by visible light. In addition to the above five factors, several other factors should also be considered. These factors including sensor type (e.g., front side illumination, or FSI sensors tend to have lower IR sensitivity than back side illumination, or BSI sensors), pixel's inherent sensitivity to IR, pixel size (e.g., larger pixel is more sensitive to IR), etc. In one experiment, when IR LED is pulse flashed for 0.5 ms, a pixel exposure time of 8 ms yields an unsatisfactory result of IR signal to visible noise ratio of less than 10. When the pixel exposure time is reduced to 2.5 ms, the IR signal to visible noise ratio reaches a satisfactory level of over ten.

Figure 8:
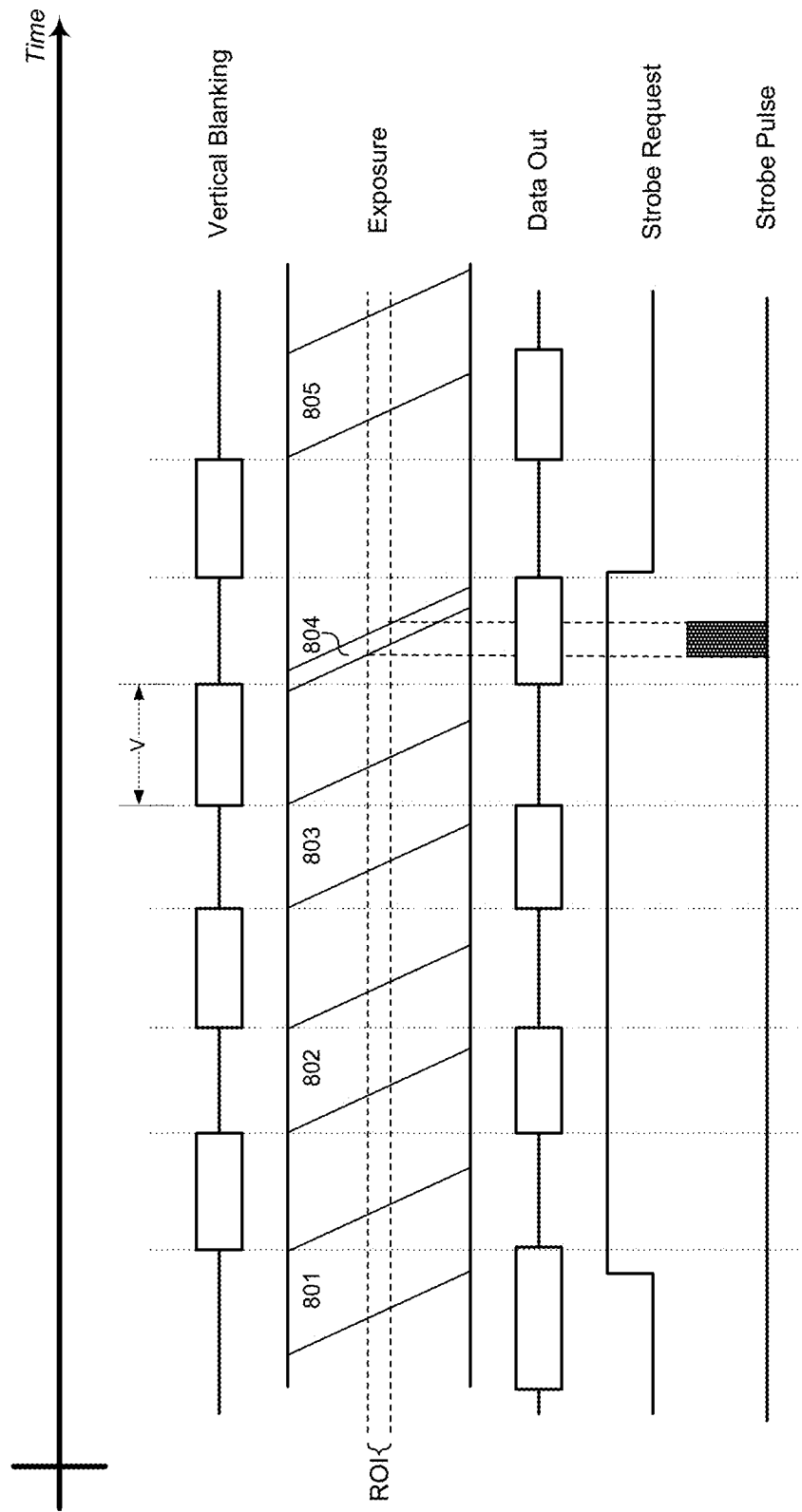
FIG. 8 is a timing diagram illustrating an embodiment of the timing of various events during capturing an image of a region of interest with a non-visible wavelength of light.

FIG. 8 illustrates an embodiment of a timing diagram for functions that implement process 600. In FIG. 8, the horizontal axis at the top represents time and hence the lines below the horizontal axis illustrate the timing of five different functions used in an implementation of process 600. The illustrated timings are of the vertical blanking period, the exposure, the data output, the assertion of the strobe request, and the strobe pulse.

The first row shows the timing of the vertical blanking period. A vertical blanking period, also known as a vertical blanking interval, is the time between when the rolling shutter finishes capture of the final line of a frame and when it starts capture of the first line of the next frame. The vertical blanking period can be used to adjust the exposure time of an image frame; for a given frame rate, a longer blanking period means a shorter exposure. The second row illustrates the exposure—in this case, the capture of multiple image frames. In the exposure line each parallelogram 801 through 805 is an image frame, meaning that some of several image frames are captured. As explained above, one or more early flame frames are used for functions such as exposure time adjustment and then discarded. In the drawing, the fourth complete frame 804 is used for capture of the ROI image, although other embodiments can use a different frame for the capture of the ROI image.

The third row of FIG. 8 shows the timing of the data output (i.e., output of the image data from each captured frame). The fourth row shows the assertion of the strobe request. The strobe request is asserted in an earlier frame and de-asserted after capture of the non-visible image of the ROI. The fifth and final row shows the timing of the strobe pulls; as discussed above, the strobe pulls happens during exposure by the rolling shutter of the ROI as discussed above.

The above description of illustrated embodiments of the invention, including what is described in the abstract, is not intended to be exhaustive or to limit the invention to the precise forms disclosed. Although specific embodiments of, and examples for, the invention are described herein for illustrative purposes, various equivalent modifications are possible within the scope of the invention, as those skilled in the relevant art will recognize. These modifications can be made to the invention in light of the above detailed description.

The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

The invention claimed is:

1. An image sensor comprising:
a pixel array comprising a plurality of pixels arranged in rows and columns;
a color filter array optically coupled to the pixel array, the color filter array comprising a plurality of tiled minimal repeating units, each minimal repeating unit including:
a plurality of individual filters wherein the spectral photoresponses of the individual filters include at least three dual-band spectral photoresponses and one single-band spectral photoresponse; and
circuitry and logic coupled to the pixel array, wherein the logic comprises instructions that, when executed by the circuitry, cause the image sensor to:
capture a first image frame using an image sensor, the image sensor including a pixel array comprising a plurality of pixels arranged in rows and columns and a color filter array optically coupled to the pixel array;
determine a region of interest within the first image frame;
adjust the exposure time of the image sensor to eliminate a substantial fraction of the visible light captured by the image sensor;
use a rolling shutter procedure with the pixel array to capture at least one subsequent frame using the adjusted exposure time;
activate a source of invisible radiation while the rolling shutter enters the region of interest and deactivating the source of invisible radiation when the rolling shutter exits the region of interest wherein activating the source of invisible radiation while the rolling shutter scans through the region of interest comprises determining a delay based on the position of the region of interest within the image frame, determining a duration for the activation of the source of invisible radiation based on the dimensions of the region of interest, and determining an intensity of the source of invisible radiation based on the adjusted exposure time; and
output an image of the region of interest.

2. The image sensor of claim 1 wherein each dual-band spectral photoresponse includes a visible photoresponse and an non-visible photoresponse and wherein the single-band spectral photoresponse is the invisible spectral photoresponse.

3. The image sensor of claim 2 wherein the invisible photoresponse is infrared.

4. The image sensor of claim 2 wherein the visible photoresponses are selected from a set of primary colors including red, green, blue, magenta, cyan, and yellow.

5. The image sensor of claim 1 wherein the minimal repeating unit is:

| D1 | D2 |
| D3 | S  | wherein D1, D2, and D3 represent individual dual-band filters and S represents an individual single-band filter.

6. The image sensor of claim 5 wherein D1 has red and infrared spectral photoresponses, D2 has green and infrared spectral photoresponses, D3 has blue and infrared photoresponses, and S has an infrared spectral photoresponse.

7. The image sensor of claim 1, further comprising a radiation source coupled to the circuitry and logic, wherein the radiation source emits radiation at an invisible wavelength that corresponds to the spectral photoresponse of the single-band filter and wherein the logic includes instructions that, when executed by the circuitry, cause the circuitry to selectively activate and deactivate the radiation source.

8. The image sensor of claim 1 wherein the delay is the time between when the rolling shutter starts scanning the first row of the image frame and when the rolling shutter starts scanning the first row of the region of interest.

9. A process comprising:
capturing a first image frame using an image sensor, the image sensor including a pixel array comprising a plurality of pixels arranged in rows and columns and a color filter array optically coupled to the pixel array;
determining a region of interest within the first image frame;
adjusting the exposure time of the image sensor to eliminate a substantial fraction of the visible light captured by the image sensor;
using a rolling shutter procedure with the pixel array to capture at least one subsequent frame using the adjusted exposure time;
activating a source of invisible radiation while the rolling shutter enters the region of interest and deactivating the source of invisible radiation when the rolling shutter exits the region of interest, wherein activating the source of invisible radiation while the rolling shutter scans through the region of interest comprises determining a delay based on the position of the region of interest within the image frame, determining a duration for the activation of the source of invisible radiation based on the dimensions of the region of interest and determining an intensity of the source of invisible radiation based on the adjusted exposure time; and
outputting an image of the region of interest.

10. The process of claim 9 wherein activating the source of invisible radiation while the rolling shutter scans through the region of interest and deactivating the source of invisible radiation when the rolling shutter exits the region of interest comprises:
waiting for the delay to pass after a starting time of the image frame;
when the delay has expired, activating the source of invisible radiation at the determined intensity;
waiting for the duration to pass after activating the source of invisible radiation; and
when the duration has expired, deactivating the source of invisible radiation.

11. The process of claim 9 wherein the output image of the region of interest is a full-resolution image at the wavelength of the invisible radiation.

12. The process of claim 8 wherein the adjusted exposure time is determined by a process comprising:

capturing one or more discardable image frames taken at different exposure times; and determining the adjusted exposure time based on the one or more discardable image frames.

13. The process of claim 12 wherein adjusting the exposure time comprises adjusting the length of a vertical blanking interval.

14. The process of claim 9 wherein the first image frame is a visible-light image.

15. The process of claim 9 wherein the delay is the time between when the rolling shutter starts scanning the first row of the image frame and when the rolling shutter starts scanning the first row of the region of interest.

* * * * *